(12) United States Patent
Kawamura et al.

(10) Patent No.: US 11,120,847 B2
(45) Date of Patent: Sep. 14, 2021

(54) APPARATUSES AND METHOD FOR REDUCING ROW ADDRESS TO COLUMN ADDRESS DELAY FOR A VOLTAGE THRESHOLD COMPENSATION SENSE AMPLIFIER

(71) Applicant: MICRON TECHNOLOGY, INC., Boise, ID (US)

(72) Inventors: Christopher Kawamura, Boise, ID (US); Tae H. Kim, Boise, ID (US)

( * ) Notice: Subject to any disclaimer, the term of this patent is extended or adjusted under 35 U.S.C. 154(b) by 0 days.

(21) Appl. No.: 16/747,824

(22) Filed: Jan. 21, 2020

(65) Prior Publication Data

US 2020/0160893 A1 May 21, 2020

Related U.S. Application Data

(62) Division of application No. 16/017,826, filed on Jun. 25, 2018, now Pat. No. 10,541,008.

(51) Int. Cl.
| | |
|---|---|
| *G11C 7/02* | (2006.01) |
| *G11C 7/06* | (2006.01) |
| *G11C 11/4091* | (2006.01) |
| *G11C 8/10* | (2006.01) |
| *G11C 7/12* | (2006.01) |
| *G11C 11/4074* | (2006.01) |

(52) U.S. Cl.
CPC ............... *G11C 7/065* (2013.01); *G11C 7/12* (2013.01); *G11C 8/10* (2013.01); *G11C 11/4074* (2013.01); *G11C 11/4091* (2013.01)

(58) Field of Classification Search
CPC ....................................................... G11C 7/12
USPC .................................................... 365/210.11
See application file for complete search history.

(56) References Cited

U.S. PATENT DOCUMENTS

| | | |
|---|---|---|
| 2011/0205820 A1 | 8/2011 | Takayama et al. |
| 2017/0110161 A1 | 4/2017 | Seo |
| 2018/0233192 A1 | 8/2018 | Won et al. |
| 2019/0392872 A1 | 12/2019 | Kawamura et al. |

*Primary Examiner* — Hoai V Ho

(57) ABSTRACT

Apparatuses and methods for reducing row address (RAS) to column address (CAS) delay are disclosed. An example apparatus includes a memory including a memory cell coupled to a first digit line in response to a wordline being set to an active state, and a sense amplifier configured to, during a sense operation, couple a first gut node to the first digit line and couple a second gut node to a second digit line in response to an isolation signal. The sense amplifier is further configured to, after the first gut node is coupled to the first digit line and the second gut node is coupled to the second digit line, drive the first digit line to a first sense voltage of a first control signal and drive the second digit line to a second sense voltage of a second control signal based on a data state of the memory cell.

19 Claims, 7 Drawing Sheets

APPARATUSES AND METHOD FOR REDUCING ROW ADDRESS TO COLUMN ADDRESS DELAY FOR A VOLTAGE THRESHOLD COMPENSATION SENSE AMPLIFIER

CROSS-REFERENCE TO RELATED APPLICATION (S)

This application is a divisional of U.S. patent application Ser. No. 16/017,826, filed Jun. 25, 2018 and issued as U.S. Pat. No. 10,541,008 on Jan. 21, 2020. This application and issued patent are incorporated by reference herein in their entirety and for all purposes.

BACKGROUND

High data reliability, high speed of memory access, and reduced chip size are features that are demanded from semiconductor memory. In recent years, there has been an effort to further increase the clock speed of memories without sacrificing reliability, which, for a fixed number of clock cycles, effectively reduces an absolute time period available to perform a memory operation. One area of a memory access operation that is independent of the faster clock speeds is the time it takes to charge and discharge access lines during a memory access operation. As clock speeds increase, charging and discharging of access lines may consume an increasingly larger share of allotted time to perform some memory access operations. One time period of a memory access operation that helps define a total latency within a memory to provide data from a memory cell at an output is a minimum row address (RAS) to column address (CAS) delay, or tRCD. The tRCD is a minimum number of clock cycles required between activating a row of memory and accessing a memory cell in a column of the memory cells coupled to the activated row. Reducing the tRCD may provide more time margin for a memory device.

DETAILED DESCRIPTION OF THE EMBODIMENTS

Various embodiments of the present disclosure will be explained below in detail with reference to the accompanying drawings. The following detailed description refers to the accompanying drawings that show, by way of illustration, specific aspects and embodiments of the disclosure. The detailed description includes sufficient detail to enable those skilled in the art to practice the embodiments of the disclosure. Other embodiments may be utilized, and structural, logical and electrical changes may be made without departing from the scope of the present disclosure. The various embodiments disclosed herein are not necessary mutually exclusive, as some disclosed embodiments can be combined with one or more other disclosed embodiments to form new embodiments.

Figure 1:
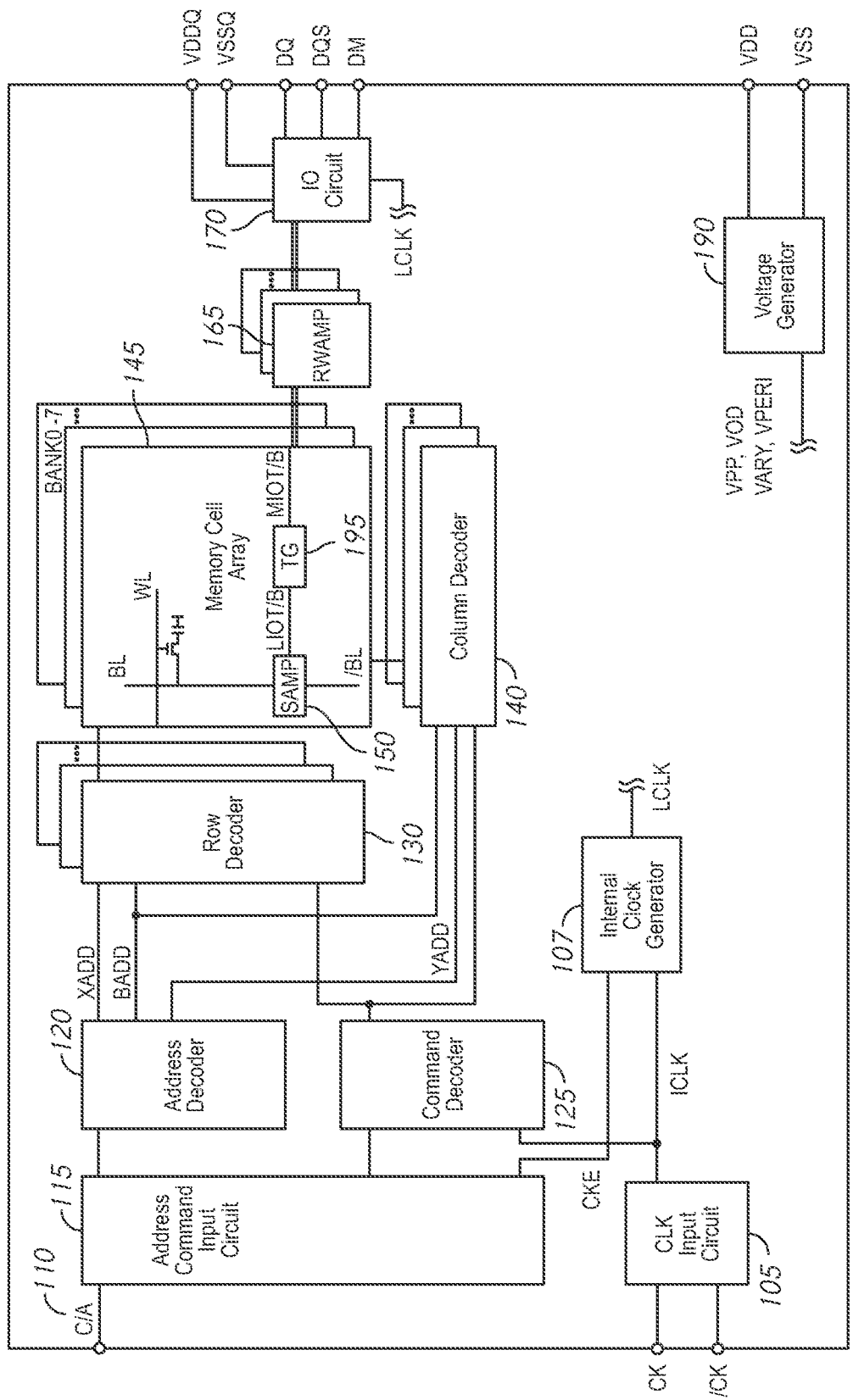
FIG. 1 is a schematic block diagram of a semiconductor device, in accordance with an embodiment of the present disclosure.

FIG. 1 is a schematic block diagram of a semiconductor device 100, in accordance with an embodiment of the present disclosure. The semiconductor device 100 may include a clock input circuit 105, an internal clock generator 107, a timing generator 109, an address command input circuit 115, an address decoder 120, a command decoder 125, a plurality of row (e.g., first access line) decoders 130, a memory cell array 145 including sense amplifiers 150 and transfer gates 195, a plurality of column (e.g., second access line) decoders 140, a plurality of read/write amplifiers 165, an input/output (I/O) circuit 170, and a voltage generator 190. The semiconductor device 100 may include a plurality of external terminals including address and command terminals coupled to command/address bus 110, clock terminals CK and /CK, data terminals DQ, DQS, and DM, and power supply terminals VDD, VSS, VDDQ, and VSSQ. The terminals and signal lines associated with the command/address bus 110 may include a first set of terminals and signal lines that are configured to receive the command signals and a separate, second set of terminals and signal lines that are configured to receive the address signals, in some examples. In other examples, the terminals and signal lines associated with the command and address bus 110 may include common terminals and signal lines that are configured to receive both command signal and address signals. The semiconductor device may be mounted on a substrate, for example, a memory module substrate, a mother board or the like.

The memory cell array 145 includes a plurality of banks BANK0-N, where N is a positive integer, such as 3, 7, 15, 31, etc. Each bank BANK0-N may include a plurality of word lines WL, a plurality of bit lines BL, and a plurality of memory cells MC arranged at intersections of the plurality of word lines WL and the plurality of bit lines BL. The selection of the word line WL for each bank BANK0-N is performed by a corresponding row decoder 130 and the selection of the bit line BL is performed by a corresponding column decoder 140. The plurality of sense amplifiers 150 are located for their corresponding bit lines BL and coupled to at least one respective local I/O line further coupled to a respective one of at least two main I/O line pairs, via transfer gates TG 195, which function as switches. The sense amplifiers 150 and transfer gates TG 195 may be operated based on control signals from decoder circuitry, which may include the command decoder 120, the row decoders 130, the column decoders 140, any control circuitry of the memory cell array 145 of the banks BANK0-N, or any combination thereof. In some examples, the tRCD for the semiconductor device 100 may involve operations of the row decoders 130, the column decoders 140, and circuitry of the memory cells array 145 of each of the plurality of banks BANK0-N (e.g., including the plurality of sense amplifiers 150 and the transfer gates TG 195). In some examples, the plurality of sense amplifiers 150 may include threshold voltage compensation circuitry that compensates for threshold voltage differences between components of the sense amplifiers 150. As circuit components become smaller, clock speeds become faster, and voltage/power consumption requirements are reduced, small variance between circuit components introduced during fabrication (e.g., process, voltage, and temperature (PVT) variance) may reduce operational reliability of the semiconductor device 100. To mitigate effects of these variations, compensating for some of these threshold voltage Vt differences may include, before activating the sense amplifier 150 to sense data, biasing bit lines BL and /BL coupled to the sense amplifiers 150 using internal nodes of the sense amplifier 150 that are configured to provide sensed data to an output (e.g., gut nodes). The bias of the bitlines BL and /BL may be based on threshold differences between at least two circuit components (e.g., transistors) of the sense amplifier 150. While compensating for threshold voltage Vt differences between circuit components within the sense amplifier 150 may improve reliability, adding an additional phase (e.g., the threshold voltage compensation phase) to a sense operation may increase the tRCD. In some examples, adjusting or changing timing of steps of some operations of a sense operation may improve tRCD. For example, after performing threshold voltage compensation and gut node equalization, the gut nodes of the sense amplifiers 150 may be coupled to the respective bit lines BL and /BL prior to activating (e.g., firing) the sense amplifiers 150 to begin sensing data during the sense operation may reduce tRCD, as compared with activating the sense amplifiers before coupling the gut nodes to the respective bit lines BL and /BL. If the sense amplifiers 150 are activated before coupling the gut nodes to the respective bit lines BL and /BL, when the gut nodes are coupled to the respective bit lines BL and /BL, the voltages of the gut nodes may initially discharge/charge toward the precharge voltage when the respective bitlines BL and /BL are coupled, before resuming a charge/discharge to respective sense voltages. This brief discharge/charge period may introduce an extra delay in making sensed data available, and therefore may increase tRCD. By first coupling the internal nodes of the sense amplifiers 150 to the respective bit lines BL and /BL, and then activating (e.g., firing) the sense amplifiers 150, the brief discharge/charge delay period of the gut nodes may be reduced or avoided, which may reduce tRCD.

The address/command input circuit 115 may receive an address signal and a bank address signal from outside at the command/address terminals via the command/address bus 110 and transmit the address signal and the bank address signal to the address decoder 120. The address decoder 120 may decode the address signal received from the address/command input circuit 115 and provide a row address signal XADD to the row decoder 130, and a column address signal YADD to the column decoder 140. The address decoder 120 may also receive the bank address signal and provide the bank address signal BADD to the row decoder 130 and the column decoder 140.

The address/command input circuit 115 may receive a command signal from outside, such as, for example, a memory controller 105 at the command/address terminals via the command/address bus 110 and provide the command signal to the command decoder 125. The command decoder 125 may decode the command signal and generate various internal command signals. For example, the internal command signals may include a row command signal to select a word line, or a column command signal, such as a read command or a write command, to select a bit line.

Accordingly, when a read command is issued and a row address and a column address are timely supplied with the read command, read data is read from a memory cell in the memory cell array 145 designated by the row address and the column address. The read/write amplifiers 165 may receive the read data DQ and provide the read data DQ to the IO circuit 170. The IO circuit 170 may provide the read data DQ to outside via the data terminals DQ, DQS and DM together with a data strobe signal at DQS and a data mask signal at DM. Similarly, when the write command is issued and a row address and a column address are timely supplied with the write command, and then the input/output circuit 170 may receive write data at the data terminals DQ, DQS, DM, together with a data strobe signal at DQS and a data mask signal at DM and provide the write data via the read/write amplifiers 165 to the memory cell array 145. Thus, the write data may be written in the memory cell designated by the row address and the column address.

Turning to the explanation of the external terminals included in the semiconductor device 100, the clock terminals CK and /CK may receive an external clock signal and a complementary external clock signal, respectively. The external clock signals (including complementary external clock signal) may be supplied to a clock input circuit 105. The clock input circuit 105 may receive the external clock signals and generate an internal clock signal ICLK. The clock input circuit 105 may provide the internal clock signal ICLK to an internal clock generator 107. The internal clock generator 107 may generate a phase controlled internal clock signal LCLK based on the received internal clock signal ICLK and a clock enable signal CKE from the address/command input circuit 115. Although not limited thereto, a DLL circuit may be used as the internal clock generator 107. The internal clock generator 107 may provide the phase controlled internal clock signal LCLK to the IO circuit 170 and a timing generator 109. The IO circuit 170 may use the phase controller internal clock signal LCLK as a timing signal for determining an output timing of read data. The timing generator 109 may receive the internal clock signal ICLK and generate various internal clock signals.

The power supply terminals may receive power supply voltages VDD and VSS. These power supply voltages VDD and VSS may be supplied to a voltage generator circuit 190. The voltage generator circuit 190 may generate various internal voltages, VPP, VOD, VARY, VPERI, and the like based on the power supply voltages VDD and VSS. The internal voltage VPP is mainly used in the row decoder 130, the internal voltages VOD and VARY are mainly used in the sense amplifiers 150 included in the memory cell array 145, and the internal voltage VPERI is used in many other circuit blocks. In some examples, voltages P1 and P2 may be equal to a respective one of the internal voltages VPP, VOD, VARY, VPERI. The IO circuit 170 may receive the power supply voltages VDD and VSSQ. For example, the power supply voltages VDDQ and VSSQ may be the same voltages as the power supply voltages VDD and VSS, respectively. However, the dedicated power supply voltages VDDQ and VSSQ may be used for the IO circuit 170.

Figure 2:
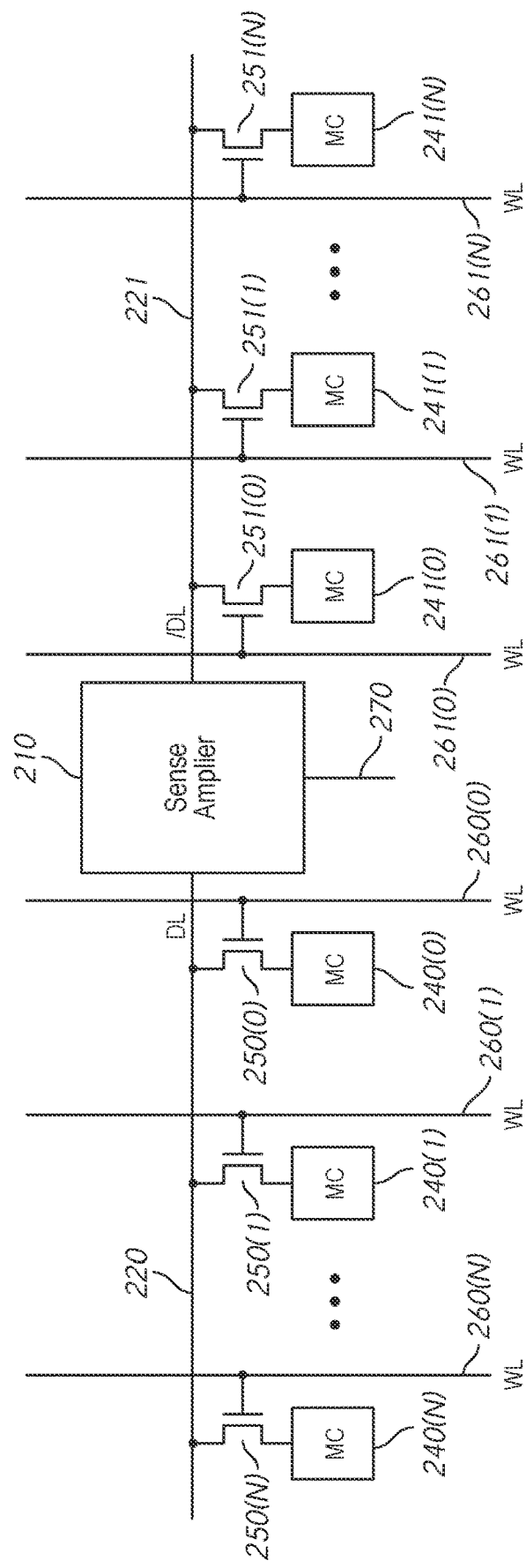
FIG. 2 is a schematic diagram of a sense amplifier and a pair of complementary digit lines in accordance with an embodiment of the disclosure.

FIG. 2 is a schematic diagram of a portion of a memory 200 that includes a sense amplifier 210 and a pair of complementary digit lines DL 220 and /DL 221 in accordance with an embodiment of the disclosure. As shown in FIG. 2, the sense amplifier 210 is coupled to the pair of true and complementary digit (or bit) lines DL 220 and /DL 221. The memory cells 240(0)-(N) may be selectively coupled through respective access devices (e.g., transistors) 250(0)-(N) to the digit line DL 220 and memory cells 241(0)-(N) may be selectively coupled through respective access devices (e.g., transistors) 251(0)-(N) to the digit line /DL 221. Wordlines WL 260(0)-(N) may control which of the memory cells 240(0)-(N) is coupled to the digit line DL 220 by controlling a gate of a respective access device 250(0)-(N). Similarly, wordlines WL 261(0)-(N) may control which of the memory cells 241(0)-(N) is coupled to the digit line DL 221 by controlling a gate of a respective access device 251(0)-(N). The sense amplifier 210 may be controlled via control signals 270 received via a decoder circuit, such as any of a command decoder (e.g., the command decoder 125 of FIG. 1), a row decoder (e.g., the row decoder 130 of FIG. 1), a column decoder (e.g., the column decoder 140 of FIG. 1), memory array control circuitry (e.g., the control circuitry of the memory cell array 145 of the memory banks BANK0-N of FIG. 1), or any combination thereof.

In operation, a memory cell of the memory cells 240(0)-(N) is coupled to the digit line DL 220 through the respective access device 250(0)-(N) in response to a respective word line 260(0)-(N) becoming active. A data state stored by the memory cell is sensed and amplified by the sense amplifier 210 to drive the digit line DL 220 to a high or low voltage level corresponding to the sensed data state. The other digit line /DL 221 is driven to the complementary voltage level during the sense operation.

Similarly, a memory cell of the memory cells 241(0)-(N) is coupled to the digit line /DL 221 through the respective access device 251(0)-(N) in response to a respective word line 261(0)-(N) becoming active. A data state stored by the memory cell is sensed and amplified by the sense amplifier 210 to drive the digit line /DL 221 to a high or low voltage level corresponding to the sensed data state. The other digit line DL 220 is driven to the complementary voltage level during the sense operation.

In some examples, sense amplifier 210 may include threshold voltage compensation circuitry that compensates for threshold voltage differences between components of the sense amplifier 210 during a sense operation. To perform the threshold voltage compensation, the sense amplifier 210 may, during a compensation phase of a sense operation, precharge or bias the digit lines DL 220 and /DL 221 such that a voltage difference between the digit line DL 220 and the /DL 221 is approximately equal to threshold voltage differences between at least two circuit components of the sense amplifier 210. In some examples, the threshold voltage difference may be based on Nsense transistors of the sense amplifier 210. While compensating for threshold voltage Vt differences between circuit components within the sense amplifier 150 may improve reliability, adding an additional phase (e.g., the threshold voltage compensation phase) to a sense operation may increase the tRCD.

To reduce tRCD, after equalizing internal nodes configured to provide sensed data (e.g., gut nodes) of the sense amplifier 210, the internal nodes of the sense amplifier 210 may be coupled to the respective digit lines DL 220 and /DL 221 prior to activating (e.g., firing) the sense amplifier 210 to begin sensing data of a coupled memory cell of the memory cells 240(0)-(N) or 241(0)-(N) during the sense operation. If the sense amplifier 210 is activated before coupling the gut nodes to the respective digit lines DL 220 and /DL 221, when the gut nodes are coupled to the respective digit lines DL 220 and /DL 221, the voltages of the gut nodes may initially discharge/charge toward the precharge voltage when the respective digit lines DL 220 and /DL 221 are coupled, before resuming a charge/discharge to respective sense voltages. This brief discharge/charge period may introduce an extra delay in making sensed data available, and therefore may increase tRCD. By first coupling the gut nodes of the sense amplifier 210 to the respective digit lines DL 220 and /DL 221, and then activating (e.g., firing) the sense amplifier 210, the brief discharge/charge delay period may be reduced or avoided, which may reduce tRCD.

Figure 3:
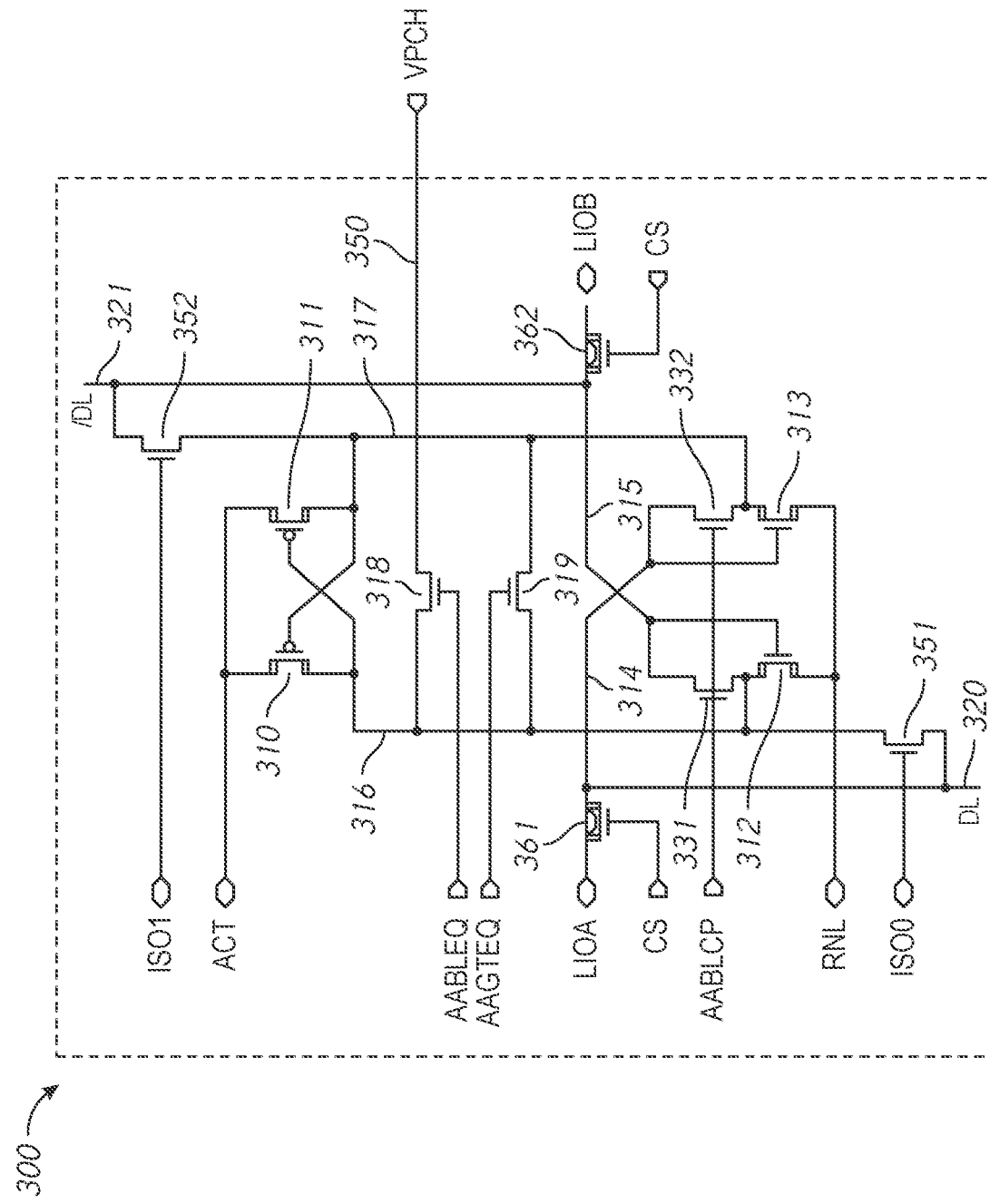
FIG. 3 is a circuit diagram of a sense amplifier in accordance with an embodiment of the disclosure.

FIG. 3 is a circuit diagram of a sense amplifier 300 in accordance with an embodiment of the disclosure. The sense amplifier 300 may be included in one or more of the sense amplifiers 150 of FIG. 1 and/or the sense amplifier 210 of FIG. 2. The sense amplifier 300 may include first type of transistors (e.g. p-type field effect transistors (PFET)) 310, 311 having drains coupled to drains of second type of transistors (e.g., n-type field effect transistors (NFET) 312, 313, respectively. The first type of transistors 310, 311 and the second type of transistors 312, 313 form complementary transistor inverters including a first inverter including the transistors 310 and 312 and a second inverter including the transistors 311 and 313. The first type of transistors 310, 311 may be coupled to a Psense amplifier control line (e.g., an activation signal ACT), which may provide a supply voltage (e.g., an array voltage VARY) at an active "high" level. The second type of transistors 312, 313 may be coupled to an Nsense amplifier control line (e.g., a Row Nsense Latch signal RNL) that may provide a reference voltage (e.g., a ground (GND) voltage) at an active "low" level. The sense amplifier 300 may sense and amplify the data state applied to sense nodes 314, 315 through the digit (or bit) lines DL 320 and /DL 321, respectively. Nodes 316 and 317 that may be gut nodes coupled to drains of the second type of transistors 312, 313 may be coupled to the digit lines DL 320 and /DL 321 via isolation transistors 351 and 352. The isolation transistors 351 and 352 may be controlled by isolation signals ISO0 and ISO1. The digit lines DL 320 and /DL 321 (sense nodes 314 and 315) may be coupled to local input/output nodes A and B (LIOA/B) through the second type of transistors 361 and 362, respectively, which may be rendered conductive when a column select signal CS is active. LIOT and LIOB may correspond to the LIOT/B lines of FIG. 1, respectively.

The sense amplifier may further include additional second type of transistors 331, 332 that have drains coupled to the sense nodes 315 and 314 and sources coupled to both the gut nodes 316 and 317 and the drains of the second type of transistors 312 and 313. Gates of the second types of transistors 331, 332 may receive a bit line compensation signal AABLCP and may provide voltage compensation for threshold voltage imbalance between the second type of transistors 312 and 313. The sense amplifier 300 may further include transistors 318, 319, where the transistor 318 may couple the gut node 316 to a global power bus 350 and the transistor 319 may couple the gut node 316 to the gut node 317. The global power bus 350 may be coupled to a node that is configured to provide a precharge voltage VPCH. In some examples, the VPCH voltage is bit line precharge voltage VBLP. In some examples, the VPCH voltage may be set to the VARY voltage during some phases of a sense operation. The voltage of the array voltage VARY may be less than the voltage of the bit line precharge voltage VBLP. In some examples, the bit line precharge voltage VBLP may be approximately one-half of the array voltage VARY. The transistors 318 and 319 may couple the global power bus 350 to the gut nodes 316 and 317 responsive to equilibrating signals AAGTEQ and AABLEQ provided on gates of the transistors 318 and 319.

In operation, the sense amplifier 300 may be configured to sense a data state of a coupled memory cell on the data lines DL 320 and /DL 321 in response to received control signals (e.g., the ISO0/ISO1 isolation signals, the ACT and RNL signals, the AABLEQ and AAGTEQ equalization signals, the CS signal, and the AABLCP signal). The control signals may be provided by a decoder circuit, such as any of a command decoder (e.g., the command decoder 125 of FIG. 1), a row decoder (e.g., the row decoder 130 of FIG. 1), a column decoder (e.g., the column decoder 140 of FIG. 1), memory array control circuitry (e.g., the control circuitry of the memory cell array 145 of the memory banks BANK0-N of FIG. 1), or any combination thereof A sense operation may include several phases, such as an initial or standby phase, a compensation phase, a gut equalize phase, and a sense phase.

Figure 4:
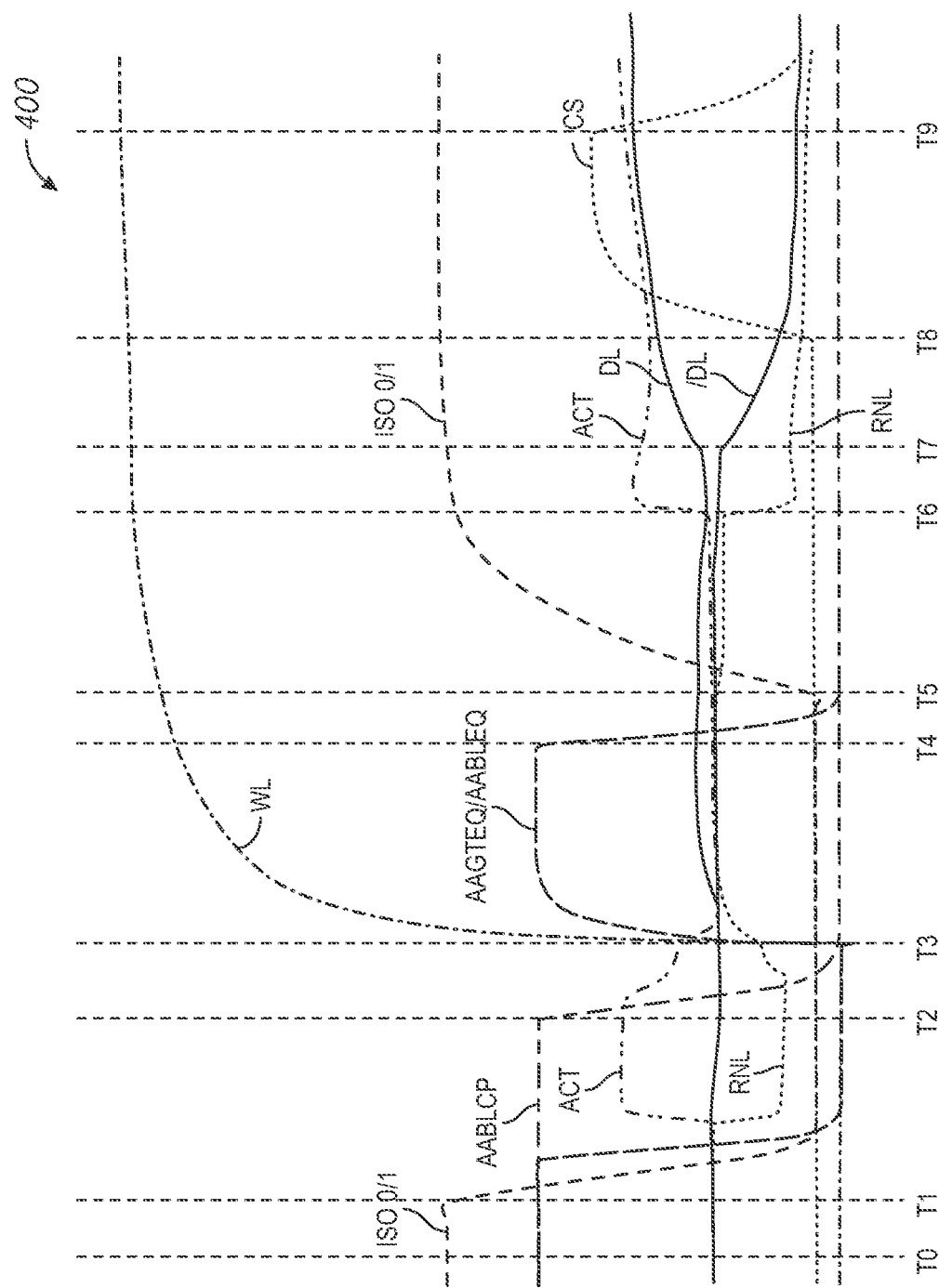
FIG. 4 is an illustration of an exemplary timing diagram depicting signal transition during a sense operation using the sense amplifier in accordance with an embodiment of the disclosure.

FIG. 4 is an illustration of an exemplary timing diagram 400 depicting signal transition during a sense operation using the sense amplifier 300 in accordance with an embodiment of the disclosure. During the initial phase (e.g., between times T0 to T1 of the timing diagram 400 of FIG. 4), the gut nodes 316 and 317 may be precharged at the VPCH voltage. For example, the global power bus 350 may be supplied with the VPCH voltage and the AABLCP signal, the ISO0/ISO1 signals, and the AAGTEQ and AABLEQ signals may be in their active states, respectively. Accordingly, while in the initial phase, each of the digit lines DL 320 and /DL 321, the sense nodes 314 and 315 and the gut nodes 316 and 317 may be precharged to the precharge voltage VPCH. In some examples, the VPCH voltage may be the VBLP voltage. The VBLP voltage may be approximately half of the VARY voltage.

After the initial phase, the sense amplifier 300 may enter the threshold voltage compensation phase (e.g., to perform a threshold voltage compensation operation) (e.g., between times T1 and T2 of the timing diagram 400 of FIG. 4), where voltages on the data lines DL 320 and /DL 321 are biased from the VPCH voltage (e.g., VBLP voltage) to compensate (e.g., provide threshold voltage compensation) for threshold voltage differences between the transistors 312, 313. During the compensation phase, at time T1, the ISO0 and ISO1 signals and the AAGTEQ and AABLEQ signals may be set to respective inactive state to disable the transistors 351, 352, 318 and 319. The AABLCP signal may remain in an active state to enable the transistors 331 and 332 to couple the nodes 314 and 315 to the gut nodes 317 and 316, respectively. Additionally, the drain and the gate of the transistor 312 may be coupled and the drain and the gate of the transistor 313 may be coupled. At time T2, the compensation phase may be completed by transitioning the AABLCP signal may to an inactive state, which disables the transistors 331 and 332 and decouples the nodes 314 and 315 from the gut nodes 317 and 316, respectively.

During the gut equalize phase (e.g., between times T3 and T4 of the timing diagram 400 of FIG. 4), the gut nodes 317 and 316 may be decoupled from the digit lines DL 320 and /DL 321 and may be coupled to each other to equalize voltages between the gut nodes 316, 317 to the VPCH voltage. During this phase, at time T3, the AAGTEQ and AABLEQ signals may transition to an active state. While the AABLCP signal is set to the inactive state, the transistors 332 and 331 may decouple the nodes 314 and 315 from the gut nodes 317 and 316. While the equilibrating signals AAGTEQ and AABLEQ are set to the active state, the transistors 318 and 319 may couple the VPCH voltage from the global power bus 350 to the gut nodes 316, 317. While the ISO0 and ISO1 signals are set to the inactive state, the isolation transistors 351 and 352 may decouple the gut nodes 317 and 316 from the digit lines DL 320 and /DL 321. After the to the gut nodes 316 and 317 are precharged to the VPCH voltage, the AAGTEQ and AABLEQ signals may be set to inactive states to disable the transistors 318 and 319, at time T4. Also during the gut equalization phase, at time T3, a wordline WL (e.g., any of the wordlines WL 260(0)-(N) or the wordlines WL 261(0)-(N) of FIG. 2) associated with the sense operation may be set to an active state. In some other examples, the wordline WL may be activated during the threshold voltage compensation phase.

During the sense phase (e.g., between times T5 and T8 of the timing diagram 400 of FIG. 4), the sense amplifier 300 may sense a data state of memory cell coupled to the data line DL 320 or /DL 321. At time T5, the ISO0 and ISO1 isolation signals may be set to an active state. At time T6, the ACT signal and the RNL signal may be activated and set to the logic high level (e.g., the VARY voltage) and the logic low level (e.g., the GND voltage), respectively. Responsive to the ISO0 and ISO1 isolation signals transitioning to the active state, the ISO transistor 351 may couple the digit line DL 320 to the gut node 316 and the ISO transistor 352 may couple the digit line /DL 321 to the gut node 317. During the sense phase, sense and amplify operations are then performed with the threshold voltage compensation voltage to balance the responses of the second type of transistors 312 and 313. For example, in response to a memory cell (e.g., one of the memory cells 240(0)-(N) or memory cells 241 (0)-(N) of FIG. 2) being coupled to a digit line DL 320 or /DL 321 through its respective access device (e.g., the respective access device 250(0)-(N) or access device 251 (0)-(N) of FIG. 2), a voltage difference is created between the digit lines DL 320 and /DL 321 (e.g., via the guts nodes 316 and 317). Thus, at time T7, the voltage difference is sensed by the second type of transistors 312, 313 as the sources of the second type of transistors 312, 313 begin to be pulled to ground through fully activated RNL signal, and one of the second type of transistors 312, 313 with a gate coupled to the digit line DL 320 or /DL 321 with the slightly higher voltage begins conducting. When a memory cell coupled to the gut node 316 through the digit line DL 320 stores a high data state, for example, the transistor 313 may begin conducting. Additionally, the other transistor 312 may become less conductive as the voltage of the gut node 317 with the slightly lower voltage decreases through the conducting transistor 313. Thus, the slightly higher and lower voltages are amplified to logic high and logic low voltages while the isolation signals ISO0 and ISO1 in the active state. As shown in the timing diagram 400 of FIG. 4, because the isolation signals ISO0 and ISO1 were set active to couple the gut nodes 316, 317 to the respective digit lines DL 320 and /DL 321 (at time T5) prior to activating sense amplifier (e.g., setting the ACT signal and the RNL signal active at time T6), the gut nodes 316, 317 (e.g., and digit lines DL 320 and /DL 321) may be steadily driven to the ACT and RNL voltages, respectively, starting at time T7. If activation of the ACT and RNL signals occurred before the isolation signals ISO0 and ISO1 were set active, the voltages of the gut nodes 316, 317 may experience a brief discharge/charge period when coupled to the digit lines DL 320 and /DL 321 before resuming charging to the ACT and RNL signal voltages, respectively, which may introduce an extra delay and increase tRCD. By first coupling the gut nodes 316, 317 to the respective digit lines DL 220 and /DL 221, and then activating the ACT signal and the RNL signal, the brief discharge/charge delay period may be reduced or avoided.

After the data state of the memory cell is sensed, and the sense nodes 314, 315 are each pulled to a respective one of the ACT signal and RNL signal voltages, a read may be performed in response to a READ command. For example, at time T8, the CS signal may be activated (e.g., in response to the READ command), the digit lines DL 320 and /DL 321 (e.g., at sense nodes 314 and 315) may be coupled to the LIO nodes (LIOT and LIOB) and the data output may be provided to the LIO nodes. Thus, the data may be read out from the LIO nodes. After a read operation is completed, at time T9, the CS signal may be set to an inactive state. The process may start over for a second sensing operation.

Figure 5:
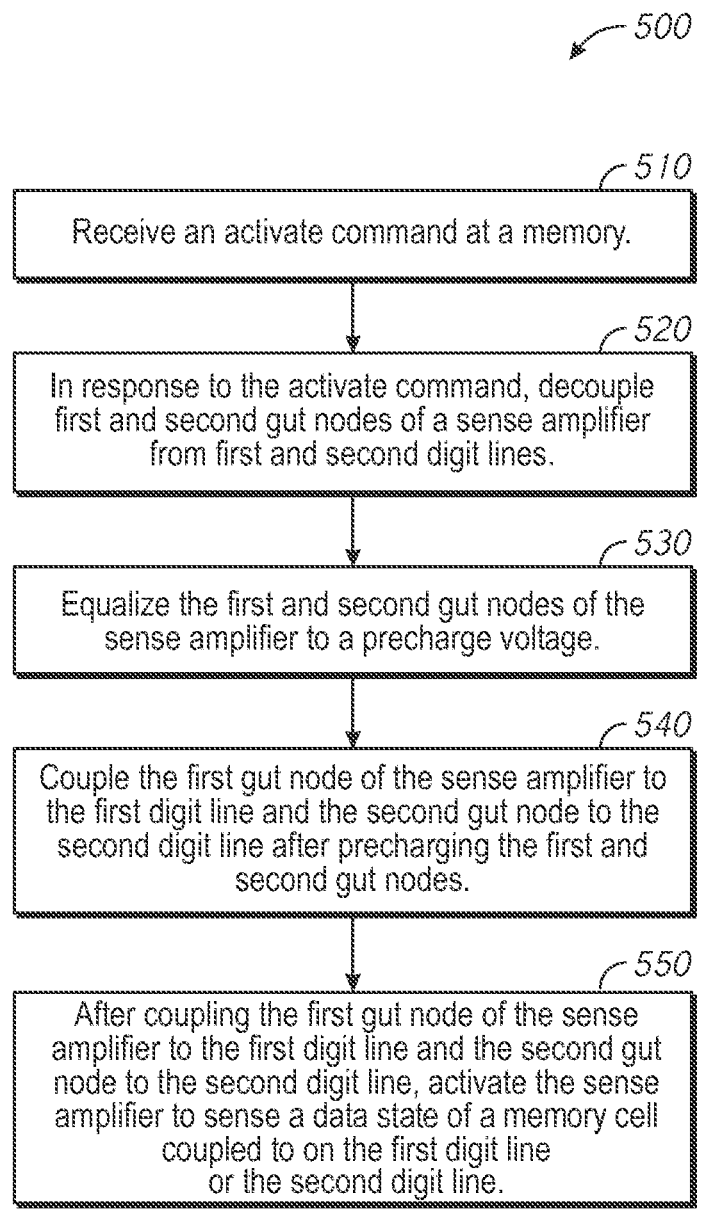
FIG. 5 is a flow diagram of a method for activation of a wordline during a voltage threshold compensation operation in accordance with embodiments of the disclosure.

FIG. 5 is a flow diagram of a method 500 for activation of as sense amplifier in accordance with embodiments of the disclosure. The method 500, all or in part, may be performed by the semiconductor device 100, a decoder circuit (e.g., any of the command decoder 125, the row decoder 130, the column decoder 140, any control circuitry of the memory cell array 145 of the memory banks BANK0-N, or any combination thereof), and/or the sense amplifiers 150 of FIG. 1, the sense amplifier 210 of FIG. 2, the sense amplifier 300 of FIG. 3, or combinations thereof.

The method 500 includes receiving an activate command at a memory, at 510. The activate command may be received via a command and address bus, such as the command address bus 110 of FIG. 1. The activate command may be decoded at a command decoder, such as the command decoder 125 of FIG. 1. Activation of the row of memory may occur during a sensing operation, such as during the gut equalization phase described with reference to FIGS. 3 and 4.

The method 500 may further include, in response to the activate command, decoupling first and second gut nodes of a sense amplifier from first and second digit lines, at 520. The sense amplifier may include any of the sense amplifiers 150 of FIG. 1, the sense amplifier 210 of FIG. 2, or the sense amplifier 300 of FIG. 3. The first and second digit lines may correspond to any of the BL or /BL of FIG. 1, the digit lines DL 220 or /DL 221 of FIG. 2, or the digit lines DL 320 or /DL 321 of FIG. 3. The first and second gut nodes may include the gut nodes 316 and/or 317 of FIG. 3. Biasing of the digit lines may include coupling the gut nodes of the sense amplifier to a respective digit line. The gut nodes may include the gut nodes 316 or 317 of FIG. 3.

The method 500 may further include, equalizing the first and second gut nodes of the sense amplifier to a precharge voltage, at 530. The precharge voltage may be the VPCH voltage of FIG. 3, which may be the VBLP voltage, or the VARY voltage in some examples. In some examples, the method 500 may further include, prior to equalizing the first and second gut nodes, performing a threshold voltage compensation operation to bias the first and second digit lines based on a threshold voltage difference between at least two circuit components of the sense amplifier. In some examples, performing the threshold voltage compensation operation to bias the digit lines coupled to the sense amplifier may be based on threshold voltage differences between a first n-type transistor and a second n-type transistor of the sense amplifier, such as the transistors 312 and 313 of FIG. 3.

The method 500 may further include, coupling the first gut node of the sense amplifier to the first digit line and the second gut node to the second digit line after equalizing the first and second gut nodes, at 540. In some examples, coupling the first gut node of the sense amplifier to the first digit line and the second gut node to the second digit line may include enabling a first transistor (e.g., one of the isolation transistors 351 or 352 of FIG. 3) coupled between the first gut node and the first digit line, and enabling a second transistor (e.g., the other of the isolation transistors 351 and 352 of FIG. 3) coupled between the second gut node and the second digit line.

The method 500 may further include, after coupling the first gut node of the sense amplifier to the first digit line and the second gut node to the second digit line, activating the sense amplifier to sense a data state of a memory cell coupled to the first digit line or the second digit line. The memory cell may be coupled to a digit line of the digit lines in response to activation of a wordline WL, such as the wordline WL of FIG. 1 or any of the wordlines WL 260(0)-(N) or 261(0)-(N) of FIG. 2. The memory cell may include the memory cell depicted in FIG. 1 or any of the memory cells 240(0)-(N) or 241(0)-(N) of FIG. 2. The memory cell may be coupled to the first or second digit line via an access device, such as any of the access devices 250(0)-(N) or 251(0)-(N) of FIG. 2. In some examples, activating the sense amplifier to sense the data state of the memory cell coupled to the first digit line or the second digit line includes providing a row Nsense latch (RNL) signal to a first pair of transistors of the sense amplifier (e.g., the transistors 312, 313 of FIG. 3), and providing a row Psense latch (ACT) signal to a second pair of transistors of the sense amplifier (e.g., the transistors 310, 311 of FIG. 3). Coupling the gut nodes to the digit lines prior to activating the sense amplifier may reduce tRCD as compared with activating the sense amplifier before coupling the digit lines to the gut nodes.

Figure 6:
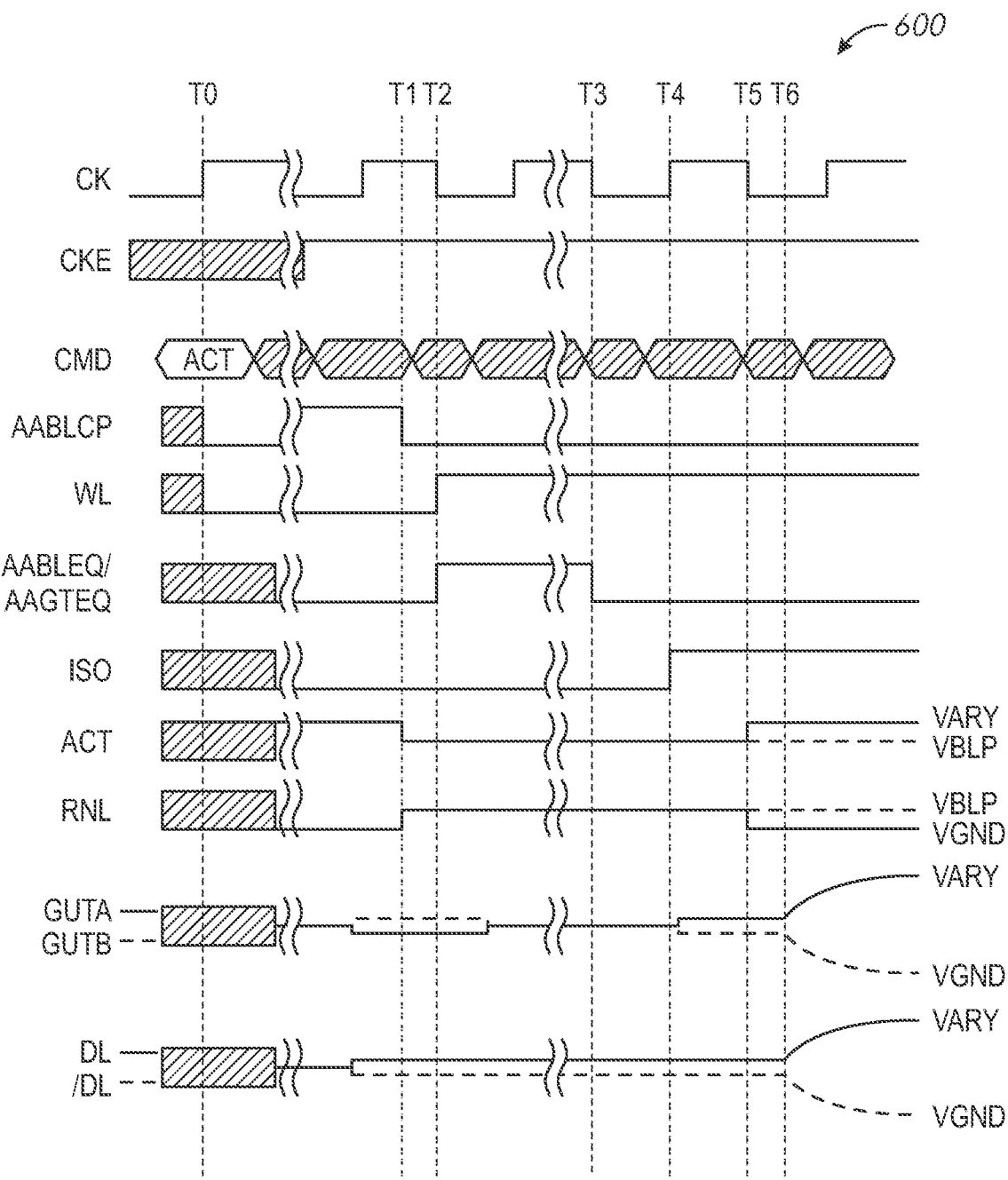
FIG. 6 is an illustration of an exemplary timing diagram depicting transition of a wordline to an active state during a voltage threshold compensation phase of a sense operation in accordance with embodiments of the disclosure.

FIG. 6 is an illustration of an exemplary timing diagram 600 depicting operation of a sense amplifier in accordance with embodiments of the disclosure. In some examples, the timing diagram 600 may depict operation of the semiconductor device 100 and/or one of the sense amplifiers 150 of FIG. 1, the sense amplifier 210 of FIG. 2, the sense amplifier 300 of FIG. 3, or combinations thereof. The CK and CKE signals may correspond to the CK and CKE signals of FIG. 1. The CMD signal may correspond to a command signal received at via the command and address bus 110 of FIG. 1. The WL signal may correspond to signals transmitted on the word lines WL of FIG. 1, the word lines WL 260(0)-(N) and word lines WL 261(0)-(N) of FIG. 2. The AABLCP, AABLEQ, AAGETQ, ISO, ACT, and RNL signals may correspond to the AABLCP, AABLEQ, AAGETQ, ISO0/1, ACT, and RNL signals of FIG. 3. The GUTA and GUTB nodes may correspond to the gut nodes 316 and 317. The digit lines DL and /DL may correspond to any of the bit lines BL and /BL of FIG. 1, the digit lines DL 220 and /DL 221 of FIG. 2, or the DL 320 or /DL 321 of FIG. 3.

At time T0, while the clock enable signal CKE is active, an activate ACT command may be received via the CMD signal responsive to the clock signal CK. In response to the ACT command, the AABLCP signal may transition to an active state (e.g., during a compensation phase of a sense operation) for a period of time between times T0 and T1. The ACT command may indicate a row of memory cells to be activated. During the compensation phase, the digit lines DL and /DL may be offset based on threshold voltage differences between transistors of the sense amplifier, such as a threshold voltage difference between the transistors 312 and 313 of FIG. 3. During the compensation phase, the GUTA node may be coupled to the digit line /DL and the GUTB node may be coupled to digit line DL. Therefore, the GUTA and GUTB nodes may also be offset based on the threshold voltage differences between transistors of the sense amplifier.

At time T1, the AABLCP signal may transition to an inactive state, indicating an end to the compensation phase. In response to the AABLCP signal transitioning to the inactive state, the GUTA node may be decoupled from digit line /DL and the GUTB node may be decoupled from digit line DL. At time T2, the AABLEQ and AAGTEQ signals may transition to an active state to initiate the gut equalization phase. During the gut equalization phase, between times T2 and T3, the GUTA and GUTB nodes (e.g., the gut nodes 316, 317) of the sense amplifier may be coupled together and to a precharge voltage VPCH (e.g., one of a VBLP or a VARY voltage). The digit lines DL and /DL may remain offset based on the threshold voltage differences between transistors of the sense amplifier. At time T4, the AABLEQ and AAGTEQ signals may transition to an inactive state to end the gut equalization phase. Also at time T2, the wordline WL may be set to an active state, which may allow the wordline WL to begin charging to a voltage that enabled an access device to couple a target memory cell to one of the digit lines DL or /DL.

At time T4, the sense phase of the sense operation may commence. During the sense phase, the ISO signal may transition to an active state to couple the GUTA and GUTB nodes to digit lines DL and /DL, respectively. At time T5, the sense amplifier may be activated (e.g., as indicated by the ACT and RNL signals transitioning to the respective VARY and VGND voltages from a common VBLP voltage). At time T6, the GUTA and GUTB nodes may begin transitioning to the respective VARY and VGND voltages based on a sensed data state of a coupled memory cell (e.g., coupled via the active wordline WL). Similarly, at time T6, the digit lines DL and /DL may begin transitioning to the respective VARY and VGND voltages based on a sensed data state of the coupled memory cell. As shown in the timing diagram 600, because the ISO signal is set active to couple the GUTA and GUTB nodes to the respective digit lines DL and /DL (at time T4) prior to activating the ACT signal and the RNL signal (at time T5), the digit lines DL and /DL may be steadily driven to the ACT and RNL voltages, respectively, starting at time T6. If activation of the ACT and RNL signals occurred before the ISO signal was set active, the voltages on the GUTA and GUTB nodes may experience a brief discharge/charge period when the digit lines DL and /DL are coupled before resuming charging to the ACT and RNL signal voltages, respectively, which may introduce an extra delay and increase tRCD. By first coupling the GUTA and GUTB nodes to the respective digit lines DL and /DL, and then activating the ACT signal and the RNL signal, the brief discharge/charge delay period may be reduced or avoided.

In some examples, if a read command READ is received via the command bus, a column select (CS) signal may be activated (e.g., in response to the READ command) after time T6, which may couple the digit lines DL and /DL to local input/output (I/O) lines to read out the data state of the memory cell.

Figure 7:
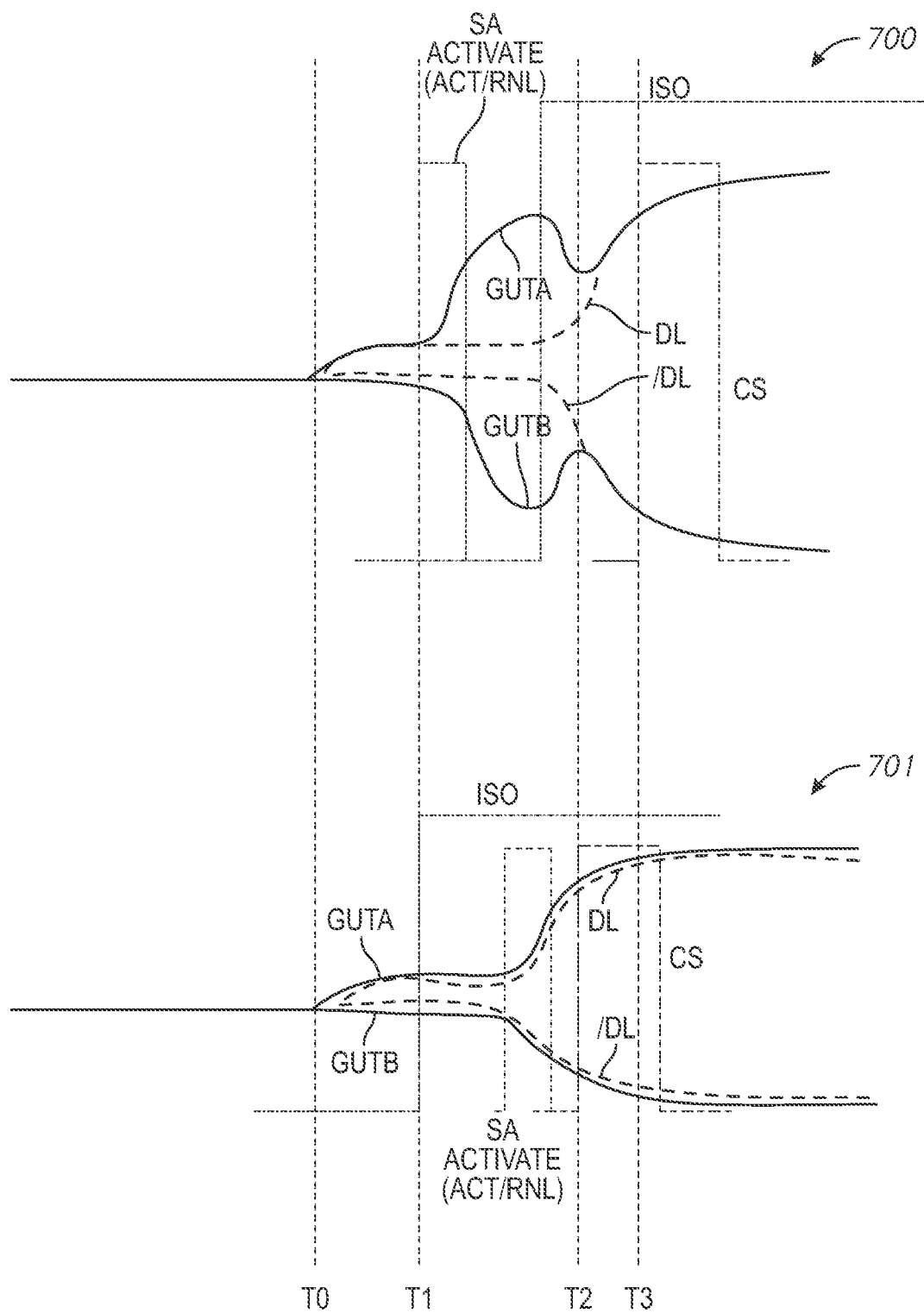
FIG. 7 is an illustration of an exemplary timing diagram depicting operation of a sense amplifier in accordance with embodiments of the disclosure.

FIG. 7 is an illustration of are exemplary timing diagrams 700 and 701 depicting a comparison of sense amplifier operation in accordance with embodiments of the disclosure. In some examples, the timing diagrams 700 and 701 may depict operation of one of the sense amplifiers 150 of FIG. 1, the sense amplifier 210 of FIG. 2, the sense amplifier 300 of FIG. 3, or combinations thereof. The DL1/2 signal and the /DL1/2 signals may correspond to signals transmitted on the digit lines BL and/BL of FIG. 1, the digit lines DL 220 and /DL 221 of FIG. 2, and/or the digit lines DL 320 and /DL 321 of FIG. 3. The ISO, CS, and SA activate signals may correspond to the ISO0/1, CS, and ACT/RNL signals of FIG. 3. The GUTA and GUTB node signals may correspond to the gut nodes 316, 317 of FIG. 3.

In reference to both timing diagrams 700 and 701, at time T0, a voltage threshold compensation operation may be initiated, which may result in voltage differences between the digit lines DL and /DL and voltage differences between the GUTA and GUTB nodes based on a threshold voltage differences of two or more circuit components within the sense amplifier, such as the transistors 312 and 313 of the sense amplifier 300 of FIG. 3.

At time T1, a sense phase may be initiated. In the timing diagram 700, the sense phase may be initiated by activating the sense amplifier (e.g., setting the ACT signal and the RNL signal active), followed by setting the ISO signal to an active state. Thus, as shown in the timing diagram 700, the GUTA and GUTB nodes begin being driven to the ACT and RNL signal voltages until the ISO signal is set active, while the digit lines DL and/DL remain at the pre-sense phase voltages. In response to the ISO signal being set active, the GUTA and GUTB node voltages are briefly pulled toward the digit line DL and/DL voltages, respectively, before recovering and continuing to drive to the ACT and RNL voltages, respectively. At time T3, the CS signal is set active to perform a read operation.

In the timing diagram 701, the sense phase may be initiated by setting the ISO signal to an active state, followed by activating the sense amplifier (e.g., setting the ACT signal and the RNL signal active). Thus, as shown in the timing diagram 701, the GUTA and GUTB nodes and the digit lines DL and/DL both remain at the pre-sense phase voltages until the sense amplifier is activated. In response to the sense amplifier being activated, the GUTA and GUTB nodes and the digit lines DL and/DL are contemporaneously and continuously pulled toward the ACT and RNL signal voltages. At time T2, the CS signal is set active to perform a read operation.

Thus, in comparing the timing of operation depicted in the timing diagram 700 with the timing of the operation depicted in the timing diagram 701, setting the ISO signal active to couple the GUTA and GUTB nodes to the digit lines DL and /DL, respectively, before activating the sense amplifier may result in a shorter tRCD delay (e.g., the time T2 to time T3 difference between the CS signal being set active).

The timing diagrams 400, 600, and 700 are exemplary for illustrating operation of various described embodiments. Although the timing diagrams 400, 600, and 700 depict a particular arrangement of signal transitions of the included signals, one of skill in the art will appreciate that additional or different transitions may be included in different scenarios without departing from the scope of the disclosure. Further, the depiction of a magnitude of the signals represented in the timing diagrams 400, 600, 700, and 800 are not intended to be to scale, and the representative timing is an illustrative example of a timing characteristics.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

What is claimed is:

1. An apparatus including:
a sense amplifier configured to perform a sense operation associated with a memory cell, wherein the sense operation includes coupling of a gut node of a sense amplifier to a digit line coupled to a memory cell via an isolation transistor in response to an isolation signal and to activate to sense a data state of the memory cell coupled to the digit line in response to sense control signals; and
a decoder circuit configured to, during the sense operation, set the isolation signal to cause the sense amplifier to couple the gut node to the digit line via the isolation transistor at a time between activation of a wordline and setting of the sense control signals to activate the sense amplifier to sense the data state of the memory cell.

2. The apparatus of claim 1, wherein the decoder circuit is further configured to activate the wordline to couple the memory cell to the digit line at a time before the isolation signal is set to couple the gut node to the digit line.

3. The apparatus of claim 1, further comprising a memory array including the memory cell and at least a portion of the decoder circuit.

4. The apparatus of claim 1, wherein the digit line is a first digit line, wherein the decoder circuit is further configured to cause the sense amplifier to bias the first digit line and a second digit line coupled to the sense amplifier such that a voltage difference between the first and second digit lines is based on a threshold voltage difference between at least two components of the sense amplifier.

5. The apparatus of claim 1, wherein the sense amplifier further comprises a second isolation transistor configured to couple a second gut node of the sense amplifier to a second digit line in response to the isolation signal.

6. The apparatus of claim 5, wherein the isolation transistor and the second transistor are n-type transistors.

7. An apparatus including:
a sense amplifier coupled to a digit line and comprising an isolation transistor configured to selectively isolate a gut node of the sense amplifier from the digit line, wherein the sense amplifier is configured to sense a data state of a memory cell coupled to the digit line in response to activation; and
a decoder circuit configured to, during a sense operation, enable the isolation transistor to cause the gut node to couple to the digit line after activation of a wordline, wherein, further during the sense operation after enabling the isolation transistor, the decoder circuit is further configured to activate the sense amplifier to cause the sense amplifier to sense the data state of the memory cell after the isolation transistor is enabled.

8. The apparatus of claim 7, wherein the sense amplifier is further coupled to a second digit line and further comprises a second isolation transistor configured to selectively isolate a second gut node of the sense amplifier from the second digit line.

9. The apparatus of claim 8, wherein the decoder circuit is further configured to cause the sense amplifier to bias a voltage of the digit line relative to a voltage of the second digit line based on a threshold voltage difference between at least two components of the sense amplifier.

10. The apparatus of claim 9, wherein the at least two components of the sense amplifier are n-type transistors.

11. The apparatus of claim 7, wherein the decoder circuit is further configured to, during the sense operation, activate a wordline to couple the memory cell to the digit line before the isolation transistor is enabled to couple the gut node is coupled to the digit line.

12. The apparatus of claim 7, wherein the decoder circuit is further configured to transition a first control signal from a precharge voltage to the first sense voltage and transition a second control signal from the precharge voltage to the second sense voltage to activate the sense amplifier to sense a data state of the memory cell.

13. The apparatus of claim 12, wherein the first sense voltage is a row Nsense latch (RNL) voltage and the second sense voltage is a row Psense latch (ACT) voltage.

14. The apparatus of claim 7, wherein the decoder circuit is further configured to activate a wordline to couple the memory cell to the digit line prior to enabling the isolation transistor.

15. A method, comprising:
during a sense operation corresponding to a memory cell coupled to a digit line:
activating a wordline coupled to a row of memory cells including the memory cell;
after equalizing a pair of gut nodes of a sense amplifier, coupling one of the pair of gut nodes of a sense amplifier to the digit line after activation of the wordline; and
after coupling the one of the pair of gut nodes to the digit line, activating the sense amplifier to sense a data state of the memory cell.

16. The method of claim 15, further comprising providing a row Nsense latch (RNL) signal and a row Psense latch (ACT) signal to the sense amplifier to activate the sense amplifier to sense a data state of the memory cell.

17. The method of claim 15, further comprising enabling an isolation transistor to couple the one of the pair of gut nodes to the digit line.

18. The method of claim 16, further comprising, during the sense operation prior to coupling the gut node to the digit line, setting the gut node to a precharge voltage.

19. The method of claim 16, further comprising, during the sense operation prior to coupling the one of the pair of gut nodes to the digit line, performing a threshold voltage compensation operation to bias a voltage of the digit line based on a threshold voltage difference between at least two circuit components of the sense amplifier.

* * * * *